(12) United States Patent
Tanaka

(10) Patent No.: US 10,654,109 B2
(45) Date of Patent: May 19, 2020

(54) COATED CUTTING TOOL

(71) Applicant: TUNGALOY CORPORATION, Fukushima (JP)

(72) Inventor: Shigeki Tanaka, Iwaki (JP)

(73) Assignee: TUNGALOY CORPORATION, Iwaki-shi, Fukushima (JP)

(*) Notice: Subject to any disclaimer, the term of this patent is extended or adjusted under 35 U.S.C. 154(b) by 64 days.

(21) Appl. No.: 15/765,701

(22) PCT Filed: Sep. 29, 2016

(86) PCT No.: PCT/JP2016/078947
§ 371 (c)(1),
(2) Date: Apr. 3, 2018

(87) PCT Pub. No.: WO2017/061328
PCT Pub. Date: Apr. 13, 2017

(65) Prior Publication Data
US 2018/0281077 A1    Oct. 4, 2018

(30) Foreign Application Priority Data

Oct. 7, 2015   (JP) .................................. 2015-199018

(51) Int. Cl.
*B23B 27/14*   (2006.01)
*C23C 14/54*   (2006.01)
(Continued)

(52) U.S. Cl.
CPC ........ *B23B 27/148* (2013.01); *C23C 14/0021* (2013.01); *C23C 14/022* (2013.01);
(Continued)

(58) Field of Classification Search
USPC ........... 51/307, 309; 407/119; 428/216, 325, 428/336, 697, 698, 699, 701, 702
See application file for complete search history.

(56) References Cited

U.S. PATENT DOCUMENTS

2009/0130434 A1*  5/2009  Zhu ................... C04B 35/58014
407/119

FOREIGN PATENT DOCUMENTS

| EP | 2823923 A1 | 1/2015 |
|---|---|---|
| JP | 2009-082993 | * 4/2009 |
| JP | 2014-166672 A | 9/2014 |

OTHER PUBLICATIONS

International Search Report issued in PCT/JP2016/078947; dated Dec. 20, 2016.
(Continued)

*Primary Examiner* — Archene A Turner
(74) *Attorney, Agent, or Firm* — Studebaker & Brackett PC

(57) ABSTRACT

A coated cutting tool comprising a substrate and a coating layer formed on a surface of the substrate,
the coating layer including at least one predetermined layer, wherein:
the predetermined layer is a layer containing a compound having a composition represented by a formula below:

$$(Al_xTi_yM_{1-x-y})N$$

[wherein M denotes an element of at least one kind selected from the group consisting of Zr, Hf, V, Nb, Ta, Cr, Mo, W and Si, x denotes an atomic ratio of the Al element based on a total of the Al element, the Ti element and a metal element denoted by M, y denotes an atomic ratio of the Ti element based on a total of the Al element, the Ti element and the metal element denoted by M, x satisfies $0.60 \leq x \leq 0.85$, y satisfies $0 \leq y \leq 0.40$, and x+y satisfies $0.60 \leq x+y \leq 1.00$];
an average thickness of the predetermined layer is from 1.4 μm or more to 15 μm or less; and
the predetermined layer has an upper region and a lower region which satisfy conditions (1), (2) and (3) below:
condition (1): the upper region has an average thickness of from 0.5 μm or more to 2.5 μm or less ranging from an interface which is close to a surface of the coated cutting tool toward the substrate, the average thickness being less than an average thickness of the predetermined layer, and the lower region has an average thickness of from 0.5 μm or more to 2.5 μm or less ranging from an interface which is close to the substrate toward the surface of the coated cutting tool, the average thickness being less than the average thickness of the predetermined layer;
(2) an atomic ratio of the Al element contained in the upper region is higher, by from 3 atom % or higher to (Continued)

10 atom % or lower, than an atomic ratio of the Al element contained in the lower region; and
(3) an average particle size in the upper region is greater than an average particle size in the lower region.

11 Claims, 2 Drawing Sheets

(51) Int. Cl.
*C23C 28/04* (2006.01)
*C23C 14/00* (2006.01)
*C23C 14/32* (2006.01)
*C23C 14/02* (2006.01)
*C23C 14/06* (2006.01)

(52) U.S. Cl.
CPC ........ *C23C 14/0641* (2013.01); *C23C 14/325* (2013.01); *C23C 14/541* (2013.01); *C23C 28/044* (2013.01); *C23C 28/048* (2013.01); *B23B 2224/24* (2013.01)

(56) References Cited

OTHER PUBLICATIONS

International Preliminary Report on Patentability and Written Opinion issued in PCT/JP2016/078947; dated Apr. 10, 2018.

\* cited by examiner

COATED CUTTING TOOL

TECHNICAL FIELD

The present invention relates to a coated cutting tool.

BACKGROUND ART

In recent years, a cutting tool having a longer tool life than in the case of a conventional cutting tool has been required, along with an increasing demand for highly efficient cutting. Thus, in terms of the characteristics required for tool materials, improvements of wear resistance and fracture resistance, which are related to the life of a cutting tool, have been becoming increasingly important. In view of this, in order to improve such characteristics, a coated cutting tool is widely used which comprises, on a surface of a substrate comprised of a cemented carbide, cermet, cBN or the like, a coating layer consisting of one layer or two or more layers which is/are each comprised of a TiN layer, a TiAlN layer or the like.

Various techniques have been proposed in order to improve the above characteristics of a coating layer. For example, Patent Document 1 proposes a surface coated cutting tool comprising, on a surface of a tool substrate constituted of a tungsten carbide-based cemented carbide, a hard coating layer whose Ti content relative to a total amount of Al and Ti is from 0.15 or more to 0.45 or less (atomic ratio), wherein: the average particle size on a surface of the hard coating layer is from 0.2 μm or more to 0.5 μm or less; the average particle size of a granular crystal grain in the interface between the tool substrate and the hard coating layer is smaller, by from 0.02 μm or more to 0.1 μm or less, than the average particle size of a granular crystal grain on the surface of the hard coating layer; and the proportion of crystal grains, each of which has a particle size of 0.15 μm or less, is 20% or less.

CITATION LIST

Patent Documents

Patent Document 1: JP2014-166672 A

SUMMARY

Technical Problem

While there has been a trend in which cutting conditions are severe, compared with the prior art, in order to increase machining efficiency, a longer tool life than so far has been demanded. However, in the machining of difficult-to-machine materials with low thermal conductivity, such as a nickel-based heat-resistant alloy and a cobalt-based heat-resistant alloy, a coating included in a cutting edge is prone to be decomposed and oxidized due to the generation of heat during cutting. This results in a reduction in hardness of the coating, thereby leading to the tendency of wear to progress and also results in the embrittlement of the coating, thereby leading to the tendency of fractures to occur in the tool.

With such background, in the above-described coated cutting tool of Patent Document 1, since the Al content of the hard coating layer is uniform, oxidation resistance is insufficient. Further, the average particle size of the hard coating layer in the interface between the tool substrate and the hard coating layer is 0.1 μm or more, indicating that the adhesion therebetween is insufficient, thereby leading to insufficient fracture resistance.

The present invention has been made in order to solve these problems, and an object of the present invention is to provide a coated cutting tool which involves an improvement of fracture resistance without a reduction in wear resistance and which accordingly allows for machining over a long period of time, particularly in the machining of difficult-to-machine materials with low thermal conductivity.

Solution to Problem

The present inventor has conducted studies regarding the extension of the tool life of a coated cutting tool and has accordingly found that the following configurations of a coated cutting tool allow the fracture resistance thereof to be improved without a reduction in wear resistance, and found that the tool life of the coated cutting tool can therefore be extended, and this has led to the completion of the present invention.

Namely, the gist of the present invention is as set forth below.

[1] A coated cutting tool comprising a substrate and a coating layer formed on a surface of the substrate,
the coating layer including at least one predetermined layer, wherein:
the predetermined layer is a layer containing a compound having a composition represented by a formula below:

$$(Al_xTi_yM_{1-x-y})N$$

[wherein M denotes an element of at least one kind selected from the group consisting of Zr, Hf, V, Nb, Ta, Cr, Mo, W and Si, x denotes an atomic ratio of the Al element based on a total of the Al element, the Ti element and a metal element denoted by M, y denotes an atomic ratio of the Ti element based on a total of the Al element, the Ti element and the metal element denoted by M, x satisfies $0.60 \leq x \leq 0.85$, y satisfies $0 \leq y \leq 0.40$, and x+y satisfies $0.60 \leq x+y \leq 1.00$];
an average thickness of the predetermined layer is from 1.4 μm or more to 15 μm or less; and
the predetermined layer has an upper region and a lower region which satisfy conditions (1), (2) and (3) below:
condition (1): the upper region has an average thickness of from 0.5 μm or more to 2.5 μm or less ranging from an interface which is close to a surface of the coated cutting tool toward the substrate, the average thickness of the upper region being less than an average thickness of the predetermined layer, and the lower region has an average thickness of from 0.5 μm or more to 2.5 μm or less ranging from an interface which is close to the substrate toward the surface of the coated cutting tool, the average thickness of the lower region being less than the average thickness of the predetermined layer;
(2) an atomic ratio of the Al element contained in the upper region is higher, by from 3 atom % or higher to 10 atom % or lower, than an atomic ratio of the Al element contained in the lower region; and
(3) an average particle size in the upper region is greater than an average particle size in the lower region.

[2] The coated cutting tool according to [1], wherein:
an average particle size in the upper region is from 100 nm or more to 500 nm or less; and
an average particle size in the lower region is from 10 nm or more to 100 nm or less.

[3] The coated cutting tool according to [1] or [2], wherein:

the predetermined layer includes an intermediate region between the upper region and the lower region; and an atomic ratio of the Al element in the intermediate region is lower than that in the upper region and higher than that in the lower region.

[4] The coated cutting tool according to any one of [1] to [3], wherein:

an average particle size in the intermediate region is from 60 nm or more to 475 nm or less and is smaller than an average particle size in the upper region and greater than an average particle size in the lower region.

[5] The coated cutting tool according to any one of [1] to [4], wherein an average particle size in the lower region is from 10 nm or more to 80 nm or less.

[6] The coated cutting tool according to any one of [1] to [5], wherein the predetermined layer is a layer located closest to the substrate in the coating layer.

[7] The coated cutting tool according to any one of [1] to [6], wherein:

the coating layer comprises, on a side of the predetermined layer which is opposite to the substrate, an outer layer containing a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and an average thickness of the outer layer is from 0.1 μm or more to 3.5 μm or less.

[8] The coated cutting tool according to any one of [1] to [7], wherein an average thickness of the coating layer is from 1.5 μm or more to 15 μm or less.

[9] The coated cutting tool according to any one of [1] to [8], wherein the substrate is a cemented carbide, cermet, ceramics or a cubic boron nitride sintered body.

Advantageous Effects of Invention

The coated cutting tool of the present invention involves an improvement of fracture resistance without a reduction in wear resistance, and accordingly provides the effect of allowing the life of the coated cutting tool to be extended.

DESCRIPTION OF EMBODIMENTS

Figure 1:
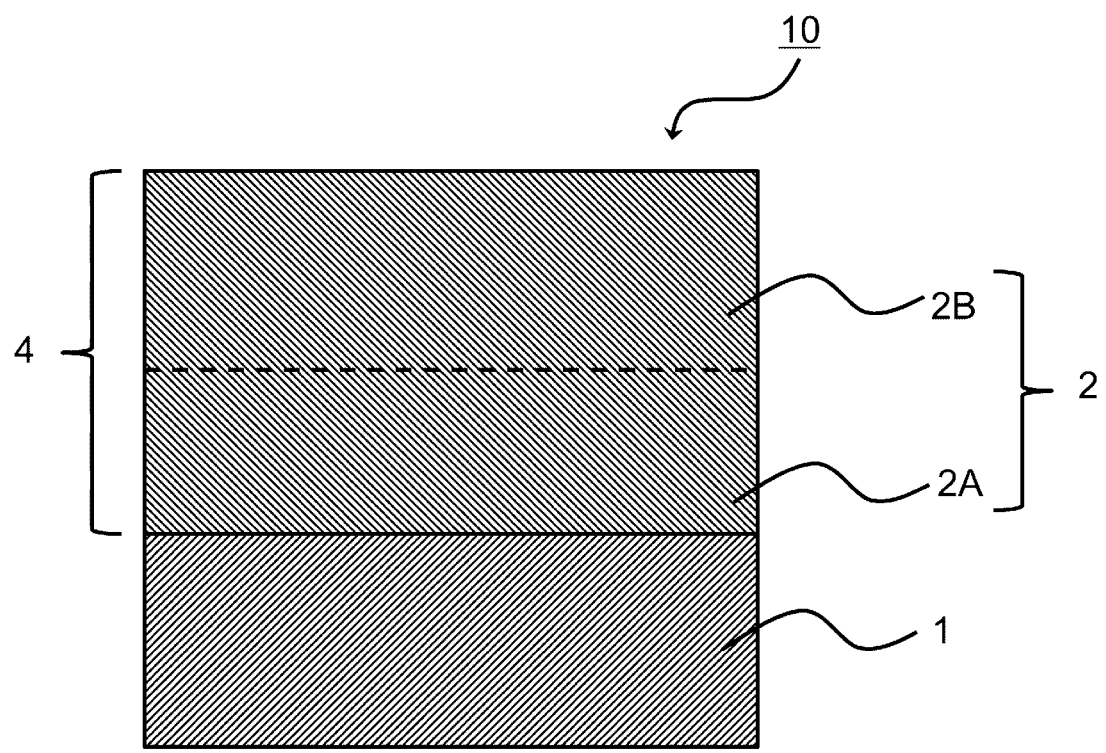
FIG. 1 is a schematic cross-sectional view showing an example of a coated cutting tool according to the present invention.

An embodiment for carrying out the present invention (hereinafter simply referred to as the "present embodiment") will hereinafter be described in detail, with reference to the attached drawings as appropriate. However, the present invention is not limited to the present embodiment below. Various modifications may be made to the present invention without departing from the gist of the invention. A coated cutting tool according to the present embodiment includes a substrate and a coating layer formed on a surface of the substrate. The substrate in the present embodiment is not particularly limited, as long as it may be used as a substrate for the coated cutting tool. Examples of the substrate include a cemented carbide, cermet, ceramic, a cubic boron nitride sintered body, a diamond sintered body and high-speed steel. From among the above examples, the substrate is further preferably comprised of a cemented carbide, cermet, ceramics or a cubic boron nitride sintered body because further excellent wear resistance and fracture resistance can be provided.

The coated cutting tool of the present embodiment shows the tendency of wear resistance to be further improved if the average thickness of the entire coating layer is 1.5 μm or more. Meanwhile, such coated cutting tool shows the tendency of fracture resistance to be further improved if the average thickness of the entire coating layer is 15 μm or less. Thus, the average thickness of the entire coating layer is preferably from 1.5 μm or more to 15 μm or less. In particular, from the same perspective as that set forth above, the average thickness of the entire coating layer is more preferably from 2.0 μm or more to 10 μm or less.

The coating layer of the present embodiment may consist of one layer or multiple layers of two or more layers. However, at least one layer of the coating layer must include a specific layer described below (hereinafter referred to as a "hard layer"). The hard layer according to the present embodiment contains a compound having the composition represented by the formula below:

$$(Al_xTi_yM_{1-x-y})N$$

Thus, such hard layer is excellent in terms of oxidation resistance. The compound having the composition represented by the formula in the hard layer of the present embodiment preferably contains cubic crystals, or contains cubic crystals and hexagonal crystals. In the formula, x denotes an atomic ratio of the Al element based on a total of the Al element, the Ti element and an element denoted by M, and x satisfies $0.60 \leq x \leq 0.85$. If the atomic ratio x of the Al element is 0.60 or more, this leads to a large content of Al, thereby allowing the reduction in oxidation resistance to be further suppressed, whereas, if the atomic ratio x of the Al element is 0.85 or less, this leads to a further reduced existence ratio of hexagonal crystals, thereby allowing the reduction in wear resistance to be further suppressed. In particular, x is preferably from 0.60 or more to 0.75 or less because a more excellent balance is achieved between oxidation resistance and wear resistance. y denotes an atomic ratio of the Ti element based on a total of the Al element, the Ti element and the element denoted by M, and y satisfies $0 \leq y \leq 0.40$. If the atomic ratio y of the Ti element is 0.40 or less, this leads to a relatively high atomic ratio of the Al element, thereby allowing the reduction in oxidation resistance to be further suppressed. Further, the atomic ratios x and y satisfy $0.60 \leq x+y \leq 1.00$. The element denoted by M is preferably an element of at least one kind selected from the group consisting of Zr, Hf, V, Nb, Ta, Cr, Mo, W and Si because the wear resistance and fracture resistance are further improved. From the same perspective, the element denoted by M is more preferably an element of at least one kind selected from the group consisting of Zr, Hf, V, Nb, Cr, Mo, W and Si.

In the present embodiment, when the composition of the hard layer is represented by $(Al_{0.6}Ti_{0.4})N$, such representation indicates that the atomic ratio of the Al element based on a total of the Al element and the Ti element is 0.6 and that the atomic ratio of the Ti element based on a total of the Al element and the Ti element is 0.4. That is, such representation indicates that the amount of the Al element based on a total of the Al element and the Ti element is 60 atom % and that the amount of the Ti element based on a total of the Al element and the Ti element is 40 atom %.

In the present embodiment, if the average thickness of the hard layer is 1.3 µm or more, this allows the reduction in wear resistance to be further suppressed, and if such thickness is 15.0 µm or less, this allows the reduction in fracture resistance to be further suppressed. Thus, the average thickness of the hard layer is from 1.3 µm or more to 15.0 µm or less. In particular, from the same perspective as that set forth above, the average thickness of the hard layer is preferably from 2.0 µm or more to 8.0 µm or less.

A hard layer according to the present embodiment includes an upper region and a lower region which satisfy conditions (1), (2) and (3) set forth below.

Condition (1): The upper region has an average thickness of from 0.5 µm or more to 2.5 µm or less ranging from an interface of the hard layer which is close to a surface of a coated cutting tool toward a substrate, the average thickness of the upper region being less than an average thickness of the hard layer, and the lower region has an average thickness of from 0.5 µm or more to 2.5 µm or less ranging from an interface of the hard layer which is close to the substrate toward the surface of the coated cutting tool, the average thickness of the lower region being less than the average thickness of the hard layer.

Condition (2): An atomic ratio of the Al element contained in the upper region is higher, by from 3 atom % or higher to 10 atom % or lower, than an atomic ratio of the Al element contained in the lower region. This leads to an improvement of oxidation resistance of the coated cutting tool, thereby resulting in an improvement of fracture resistance. From the same perspective, the atomic ratio of the Al element contained in the upper region is preferably higher, by from 3 atom % or higher to 8 atom % or lower, than the atomic ratio of the Al element contained in the lower region.

Condition (3): An average particle size in the upper region is greater than an average particle size in the lower region. This leads to an improvement in the wear resistance of the coated cutting tool. Further, the average particle size in the lower region is smaller than the average particle size in the upper region, and this allows for a reduced area of chipping. In particular, the hard layer is preferably a layer located closest to the substrate (lowermost layer) in the coating layer because this indicates the tendency of the peeling area during cutting to be reduced. From the same perspective, the average particle size in the upper region is more preferably greater, by 20 nm or more, than the average particle size in the lower region, and is further preferably greater, by 30 nm or more, than the average particle size in the lower region. The upper limit on the difference between such average particle sizes is not particularly limited, and the average particle size in the upper region may be greater, by 400 nm or less, than the average particle size in the lower region.

If the average thickness in the upper region which satisfies conditions (2) and (3) above is 0.5 µm or more, this allows oxidation resistance to be improved. Meanwhile, if the average thickness in the upper region which satisfies conditions (2) and (3) above is 2.5 µm or less, this allows the reduction in chipping resistance and fracture resistance to be suppressed. Further, if the average thickness in the lower region which satisfies conditions (2) and (3) above is 0.5 µm or more, this allows the reduction in chipping resistance and fracture resistance to be suppressed because the adhesion of the hard layer can be improved with respect to the substrate. Meanwhile, if the average thickness in the lower region which satisfies conditions (2) and (3) above is 2.5 µm or less, this allows the reduction in wear resistance to be suppressed.

As to the hard layer in the present embodiment, it is further preferable that: the average particle size in the upper region is from 100 nm or more to 500 nm or less; and the average particle size in the lower region is from 10 nm or more to 100 nm or less. This allows the wear resistance of the coated cutting tool to be further improved and also allows the chipping area to be further reduced.

The coating layer of the present embodiment includes an intermediate region between the upper region and the lower region, and it is preferable for the atomic ratio of the Al element in the intermediate region to be lower than that in the upper region and higher than that in the lower region. This indicates the tendency of the progress of oxidation toward the inside of the coated cutting tool to be suppressed.

In the intermediate region of the hard layer of the present embodiment, the average thickness is preferably from 0.1 µm or more to 2.5 µm or less. This allows the above effect from the provision of the intermediate region to be produced more effectively and reliably.

In the intermediate region of the hard layer of the present embodiment, it is preferable for the average particle size to be from 60 nm or more to 475 nm or less and to be smaller than the average particle size in the upper region and greater than the average particle size in the lower region. This provides a more excellent balance between wear resistance and fracture resistance in the coated cutting tool.

In the lower region of the hard layer of the present invention, the average particle size is preferably from 10 nm or more to 80 nm or less because this indicates the tendency of the adhesion between the substrate and the hard layer to be further excellent.

In the present embodiment, the hard layer includes at least the lower region and the upper region. Further, the atomic ratio of the Al element and the average particle size in the upper region are greater than those in the lower region, respectively. Thus, the hard layer according to the present embodiment is different from a layer whose atomic ratio of Al and average particle size are each simply uniform throughout the layer.

The coating layer according to the present embodiment may comprise an outer layer on a side of the hard layer which is opposite to the substrate (i.e., an upper layer located as a layer on the hard layer), preferably on a surface of the hard layer. The outer layer further preferably contains a compound of: an element of at least one kind selected from the group consisting of Ti, Zr, Hf, V, Nb, Ta, Cr, Mo, W, Al, Si and Y; and an element of at least one kind selected from the group consisting of C, N, O and B (however, the compound has a composition different from that of the hard layer) because this indicates the tendency of wear resistance to be further excellent. Further, from the same perspective as that set forth above, the outer layer more preferably contains a compound of: an element of at least one kind selected from the group consisting of Ti, Nb, Cr, Al and Si; and an element of at least one kind selected from the group consisting of C, N, O and B, and further preferably contains a compound of: an element of at least one kind selected from the group consisting of Ti, Nb, Cr, Al and Si; and an element of at least one kind selected from the group consisting of C and N. It should be noted, however, that the upper layer is different from the hard layer in terms of their respective compositions. Further, the upper layer may be comprised of a single layer or multiple layers of two or more layers.

The average thickness of the outer layer of the present invention is preferably from 0.1 µm or more to 3.5 µm or less because this indicates the tendency of wear resistance to be excellent.

Figure 2:
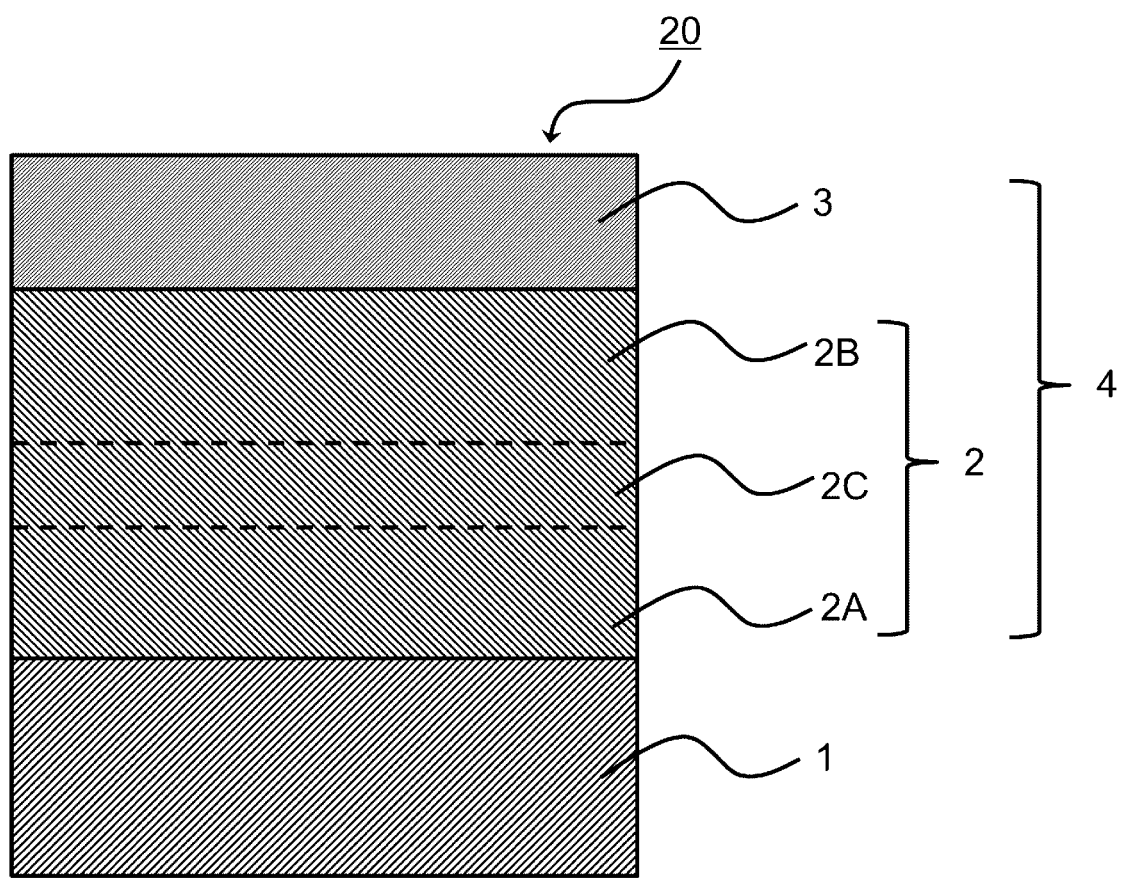
FIG. 2 is a schematic cross-sectional view showing another example of a coated cutting tool according to the present invention.

FIG. 1 is a partially schematic cross-sectional view showing an example of the coated cutting tool of the present embodiment. This coated cutting tool 10 comprises a substrate 1 and a coating layer 4 formed on a surface of the substrate 1. The coating layer 4 consists of a hard layer 2. The hard layer 2 includes a lower region 2A and an upper region 2B, in order from the substrate 1 side. FIG. 2 is a partially schematic cross-sectional view showing another example of the coated cutting tool of the present embodiment. This coated cutting tool 20 comprises a substrate 1 and a coating layer 4 formed on a surface of the substrate 1. The coating layer 4 comprises a hard layer 2 and an outer layer 3 formed on a surface of the hard layer 2, in order from the substrate 1 side. The hard layer 2 includes a lower region 2A, an intermediate region 2C and an upper region 2B, in order from the substrate 1 side.

A method of manufacturing a coating layer in a coated cutting tool according to the present embodiment is not particularly limited. However, examples of such method include physical vapor deposition methods, such as an ion plating method, an arc ion plating method, a sputtering method and an ion mixing method. The coating layer is preferably formed by a physical vapor deposition method because sharp edges can be formed. In particular, the arc ion plating method is more preferable because further excellent adhesion is achieved between the coating layer and the substrate.

A method of manufacturing a coated cutting tool according to the present embodiment will now be described using specific examples. It should be noted that the method of manufacturing a coated cutting tool according to the present embodiment is not particularly limited, as long as the configurations of the coated cutting tool may be achieved.

Firstly, a substrate processed in a tool shape is received in a reactor of a physical vapor deposition apparatus, and metal evaporation sources are placed in the reactor. At this time, two kinds of metal evaporation sources, which involve a difference in the atomic ratio of the Al element of from 3 atom % or higher to 8 atom % or lower, are placed in the reactor. Thereafter, the reactor is evacuated until the pressure therein indicates a vacuum of $1.0 \times 10^{-2}$ Pa or lower, and the substrate is heated, by a heater in the reactor, until the temperature reaches from 600° C. or higher to 700° C. or lower. After the heating, an Ar gas is introduced into the reactor so that the pressure is from 0.5 Pa or higher to 5.0 Pa or lower. In the Ar gas atmosphere with a pressure of from 0.5 Pa or higher to 5.0 Pa or lower, a bias voltage of from −350 V or higher to −500 V or lower is applied to the substrate, a current of from 40 A or higher to 50 A or lower is caused to flow through a tungsten filament in the reactor, whereby an ion bombardment process is carried out, with the Ar gas, on a surface of the substrate. After the ion bombardment process is carried out on the substrate surface, the reactor is evacuated until the pressure therein indicates a vacuum of $1.0 \times 10^{-2}$ Pa or lower.

Then, the substrate is heated so as to have a temperature of from 500° C. or higher to 600° C. or lower, a gas mixture of a nitrogen gas ($N_2$) and an argon gas (Ar) is introduced in the reactor at a partial pressure ratio ($N_2$:Ar) of from 2:8 or more to 3:7 or less, and the pressure in the reactor is adjusted so as to be from 0.5 Pa or higher to 5.0 Pa or lower. Thereafter, a bias voltage of from −80 V or higher to −100 V or lower is applied to the substrate, and, from among the two kinds of metal evaporation sources, a metal evaporation source involving a lower atomic ratio of the Al element is evaporated via an arc discharge of from 100 A or higher to 200 A or lower, whereby a lower region of a hard layer is deposited on the surface of the substrate. After starting the deposition, the lower region is formed while varying the temperature of the substrate to reach a low temperature. When the lower region is formed while varying the temperature of the substrate to reach a low temperature, the particle formation rate is slow. By rapidly slowing the particle formation rate, the lower region can be formed, having particles of a more uniform diameter and a more uniform shape.

After the formation of the lower region, the substrate is cooled until the temperature reaches from 400° C. or higher to 500° C. or lower, a gas mixture of an $N_2$ gas and an Ar gas is introduced into the reactor at a partial pressure ratio ($N_2$:Ar) of from 4:6 or more to 5:5 or less, and the pressure in the reactor is adjusted so as to be from 0.5 Pa or higher to 5.0 Pa or lower. Thereafter, a bias voltage of from −60 V or higher to −80 V or lower is applied to the substrate, and the two kinds of metal evaporation sources are evaporated via an arc discharge of from 100 A or higher to 200 A or lower, whereby an intermediate region is deposited. After starting the deposition, the intermediate region is formed while varying the temperature of the substrate to reach a low temperature. When the intermediate region is formed while varying the temperature of the substrate to reach a low temperature, the growth of particles is more significant. If the cooling rate for the substrate temperature is 10° C./hour or higher, the growth of particles is more sufficient. Meanwhile, if the cooling rate for the substrate temperature is 50° C./hour or lower, the time during which the intermediate region is substantially deposited is longer, thereby resulting in an increased thickness of the intermediate region. Therefore, the cooling rate for the substrate temperature is preferably from 10° C./hour or higher to 50° C./hour or lower.

After the formation of the intermediate region, the substrate is cooled until the temperature reaches from 300° C. or higher to 400° C. or lower, a gas mixture of an $N_2$ gas and an Ar gas is introduced into the reactor at a partial pressure ratio ($N_2$:Ar) of from 6:4 or more to 7:3 or less, and the pressure in the reactor is adjusted so as to be from 0.5 Pa or higher to 5.0 Pa or lower. Thereafter, a bias voltage of from −40 V or higher to −60 V or lower is applied to the substrate, and, from among the two kinds of metal evaporation sources, a metal evaporation source involving a higher atomic ratio of the Al element is evaporated via an arc discharge of from 100 A or higher to 200 A or lower, whereby an upper region is deposited. After starting the deposition, the upper region is formed while varying the temperature of the substrate to reach a low temperature. When the upper region is formed while varying the temperature of the substrate to reach a low temperature, the growth of particles is more significant. If the cooling rate for the substrate temperature is 10° C./hour or higher, the growth of particles is more sufficient. Meanwhile, if the cooling rate for the substrate temperature is 50° C./hour or lower, the time during which the upper region is substantially deposited is longer, thereby resulting in an increased thickness of the upper region. Therefore, the cooling rate for the substrate temperature is preferably from 10° C./hour or higher to 50° C./hour or lower.

In order to increase the average grain size in each region of the hard layer of the present embodiment, the substrate temperature during deposition may be set so as to be low. By setting the substrate temperature so as to be low, the occurrence of nuclei for each region of the hard layer is further suppressed. This suppresses the contact between nuclei, thereby resulting in an increased size of particles. It should be noted that the intermediate region and the upper region may each be preferably formed while varying the temperature of the substrate to reach a low temperature. This further suppresses the occurrence of nuclei for each region of the hard layer, thereby leading to a significant growth of particles. Further, if the bias voltage to be applied to the substrate is set so as to be low, this indicates the tendency of the particle size in each region of the hard layer to be increased. As to the coating layer, a higher atomic ratio of the Al element generally leads to a smaller particle size. Therefore, when forming the hard layer of the present embodiment, it is preferable to control the substrate temperature and the bias voltage.

In order to increase the atomic ratio of the Al element in the upper region of the hard layer of the present embodiment, it is preferable to use two kinds of metal evaporation sources having different Al element atomic ratios, and, with regard to a gas mixture of an $N_2$ gas and an Ar gas to be introduced into the reactor, it is preferable to employ a higher partial pressure for the $N_2$ gas.

The thicknesses of each layer and each region which constitute the coating layer in the coated cutting tool of the present embodiment can be measured from a cross-sectional structure of the coated cutting tool, using an optical microscope, a scanning electron microscope (SEM), a transmission electron microscope (TEM), or the like. It should be noted that, as to the average thicknesses of each layer and each region in the coated cutting tool of the present embodiment, each of such average thicknesses can be obtained by: measuring the thickness of each layer or each region, from each of the cross-sectional surfaces at three or more locations near the position 50 µm from the edge of a surface facing the metal evaporation source, toward the center of such surface; and calculating the average value (arithmetic mean) of the resulting measurements.

The compositions of each layer and each region which constitutes the coating layer in the coated cutting tool of the present embodiment can be measured from a cross-sectional structure of the coated cutting tool of the present embodiment, using an energy-dispersive X-ray spectroscope (EDS), a wavelength-dispersive X-ray spectroscope (WDS), or the like.

In the present embodiment, the average particle size of each region of the hard layer can be obtained by observing a cross-sectional structure of the hard layer. More specifically, mirror polishing is performed on a cross-sectional surface in a direction orthogonal to a surface of the substrate of the coated cutting tool (i.e., a cross-sectional surface viewed from the direction shown in FIG. 1), and the resulting mirror-polished surface is regarded as a cross-sectional structure. Examples of a method of mirror-polishing a hard layer include: a polishing method with the use of diamond paste or colloidal silica; and ion milling. A cross-sectional structure of each region is observed using an FE-SEM or TEM at a magnification of from 5,000 times or more to 20,000 times or less The particle size of each region of the hard layer is served by a distance between particles in a direction parallel to the surface of the substrate. At this time, the distance between particles is defined as a distance between positions which attain the longest distance between the particles. The measurement range is defined as a range, in each region, which is surrounded by a rectangle of 10 µm in a direction parallel to the substrate surface and 0.5 µm in a direction orthogonal to the substrate surface. The particle sizes of all the particles present in the measurement range are obtained. Measurement locations are provided near the position 50 µm from the edge of a surface facing the metal evaporation source, toward the center of such surface. Particle sizes are measured in cross-sectional structures at three or more locations, and the average value (arithmetic mean) of the obtained particle sizes of all the particles is regarded as an average particle size.

The coated cutting tool of the present embodiment involves an improvement of fracture resistance without a reduction in wear resistance, and accordingly allows for machining over a long period of time, particularly in the machining of difficult-to-machine materials with low thermal conductivity. Such coated cutting tool can be considered to involve an improvement of fracture resistance due to the point of having excellent oxidation resistance. Specific examples of types of the coated cutting tool of the present embodiment include an indexable cutting insert for milling or turning, a drill and an end mill.

EXAMPLES

Although the present invention will be described in further detail below, with examples, the present invention is not limited to such examples.

A machined cemented carbide insert with a shape of ISO certified CNMG120408 and a composition of 93.2WC-6.5Co-0.3$Cr_3C_2$ (mass %) was prepared as a substrate. In a reactor of an arc ion plating apparatus, metal evaporation sources were arranged so as to achieve the compositions of the lower region and the upper region of the hard layer, as shown in Table 1. Further, metal evaporation sources were arranged so as to achieve the compositions of the hard layer and the outer layer in each invention sample, as shown in Table 2, and metal evaporation sources were arranged so as to achieve the compositions of the respective layers in each comparative sample, as shown in Table 3. The prepared substrate was fixed to a fixation fitting of a rotating table in the reactor.

Thereafter, the reactor was evacuated until the pressure therein indicated a vacuum of $5.0 \times 10^{-3}$ Pa or lower. After the evacuation, the substrate was heated, by a heater in the reactor, until the temperature reached 600° C. After the heating, an Ar gas was introduced into the reactor such that the pressure therein was 5.0 Pa.

In the Ar gas atmosphere with a pressure of 5.0 Pa, a bias voltage of −400 V was applied to the substrate, and a current of 40 A was caused to flow through a tungsten filament in the reactor, whereby an ion bombardment process was carried out, with the Ar gas, on a surface of the substrate for 30 minutes. After the ion bombardment process, the reactor was evacuated until the pressure therein indicated a vacuum of $5.0 \times 10^{-3}$ Pa or lower.

After the evacuation, in order to form a lower region in a hard layer, the substrate was heated until the temperature reached the temperature shown in Table 4, a gas mixture of an $N_2$ gas and an Ar gas was introduced into the reactor at the partial pressure ratio shown in Table 4 so as to achieve a gas mixture atmosphere with a pressure of 3.0 Pa.

Further, the voltage (bias voltage) shown in Table 4 was applied to the substrate, and the metal evaporation source was evaporated via an arc discharge with an arc current of 120 A, whereby a lower region in a hard layer was formed.

After the formation of the lower region, in order to form an intermediate region in the hard layer, the substrate was cooled until the temperature reached the temperature shown in Table 4, and the partial pressure ratio for the gas mixture of an $N_2$ gas and an Ar gas to be introduced was changed so as to satisfy the conditions shown in Table 4 while maintaining the pressure in the reactor at 3.0 Pa.

Further, the voltage (bias voltage) shown in Table 4 was applied to the substrate, and the metal evaporation source was evaporated via an arc discharge with an arc current of 120 A, whereby the formation of an intermediate region in the hard layer was started. After starting the formation of an intermediate region, particles were formed while varying the temperature of the substrate to reach a low temperature at the cooling rate shown in Table 4.

After the formation of the intermediate region, in order to form an upper region in the hard layer, the substrate was cooled until the temperature reached the temperature shown in Table 4, and the partial pressure ratio for the gas mixture of an $N_2$ gas and an Ar gas to be introduced was changed so as to satisfy the conditions shown in Table 4 while maintaining the pressure in the reactor at 3.0 Pa.

Further, the voltage (bias voltage) shown in Table 4 was applied to the substrate, and the metal evaporation source was evaporated via an arc discharge with an arc current of 120 A, whereby the formation of an upper region in the hard layer was started. After starting the formation of an upper region, particles were formed while varying the temperature of the substrate to reach a low temperature at the cooling rate shown in Table 4.

As to invention samples 5 to 13, after the formation of the hard layer, the substrate was heated until the temperature reached 600° C., a bias voltage of −50 V was applied to the substrate, and the metal evaporation source shown in Table 1 was evaporated via an arc discharge with an arc current of 120 A, whereby an outer layer was formed on a surface of the hard layer.

As to invention sample 14, after the formation of the hard layer, the substrate was heated until the temperature reached 600° C., and the reactor was evacuated until the pressure therein indicated a vacuum of $5.0 \times 10^{-3}$ Pa or lower. Next, a gas mixture in which an $N_2$ gas and a $CH_4$ gas were mixed at a partial pressure ratio of $N_2:CH_4=1:1$ was introduced into the reactor so as to achieve a gas mixture atmosphere with a pressure of 3.0 Pa in the reactor. Then, a bias voltage of −50 V was applied to the substrate, and, via an arc discharge of an arc current of 120 A, an outer layer comprised of TiCN was formed on a surface of the hard layer.

As to comparative samples 1 to 7, a first layer was formed on the surface of the substrate under the conditions shown in Table 5. At this time, the arc current was 120 A. With regard to the conditions other than the above, the first layer was formed through the same operation as that for the formation of the hard layer in each invention sample. For the purposes of description, the regions in the first layer were regarded as a lower region, an intermediate region and an upper region, which were placed in order from the substrate side.

As to comparative samples 1 to 7, after the formation of the first layer, the substrate was heated until the temperature reached 600° C., a bias voltage of −50 V was applied to the substrate, and the metal evaporation source shown in Table 3 was evaporated via an arc discharge of an arc current of 120 A, whereby a second layer was formed on a surface of the first layer.

After the formation of each layer with the predetermined thickness shown in each of Tables 2 and 3 on the substrate surface, the heater was turned off, and the sample was taken out of the reactor after the temperature of the sample reached 100° C. or lower.

TABLE 1

| | Compositions of metal evaporation sources | |
|---|---|---|
| Sample No. | Lower region | Upper region |
| Invention sample 1 | $Al_{0.66}Ti_{0.34}$ | $Al_{0.70}Ti_{0.30}$ |
| Invention sample 2 | $Al_{0.61}Ti_{0.39}$ | $Al_{0.64}Ti_{0.36}$ |
| Invention sample 3 | $Al_{0.67}Ti_{0.33}$ | $Al_{0.75}Ti_{0.25}$ |
| Invention sample 4 | $Al_{0.80}Ti_{0.20}$ | $Al_{0.85}Ti_{0.15}$ |
| Invention sample 5 | $Al_{0.67}Ti_{0.33}$ | $Al_{0.75}Ti_{0.25}$ |
| Invention sample 6 | $Al_{0.69}Ti_{0.31}$ | $Al_{0.77}Ti_{0.23}$ |
| Invention sample 7 | $Al_{0.62}Ti_{0.20}Nb_{0.18}$ | $Al_{0.67}Ti_{0.15}Nb_{0.18}$ |
| Invention sample 8 | $Al_{0.70}Ti_{0.19}W_{0.11}$ | $Al_{0.75}Ti_{0.14}W_{0.11}$ |
| Invention sample 9 | $Al_{0.64}Ti_{0.26}Si_{0.10}$ | $Al_{0.68}Ti_{0.22}Si_{0.10}$ |
| Invention sample 10 | $Al_{0.67}Ti_{0.08}Cr_{0.25}$ | $Al_{0.63}Ti_{0.12}Cr_{0.25}$ |
| Invention sample 11 | $Al_{0.62}Ti_{0.30}Mo_{0.08}$ | $Al_{0.66}Ti_{0.26}Mo_{0.08}$ |
| Invention sample 12 | $Al_{0.75}Ti_{0.20}Hf_{0.05}$ | $Al_{0.78}Ti_{0.17}Hf_{0.05}$ |
| Invention sample 13 | $Al_{0.60}Ti_{0.33}Zr_{0.07}$ | $Al_{0.67}Ti_{0.26}Zr_{0.07}$ |
| Invention sample 14 | $Al_{0.60}Ti_{0.29}V_{0.11}$ | $Al_{0.65}Ti_{0.24}V_{0.11}$ |
| Comparative sample 1 | $Al_{0.53}Ti_{0.47}$ | $Al_{0.57}Ti_{0.43}$ |
| Comparative sample 2 | $Al_{0.74}Ti_{0.26}$ | $Al_{0.75}Ti_{0.25}$ |
| Comparative sample 3 | $Al_{0.53}Ti_{0.47}$ | $Al_{0.57}Ti_{0.43}$ |
| Comparative sample 4 | $Al_{0.85}Ti_{0.15}$ | $Al_{0.88}Ti_{0.12}$ |
| Comparative sample 5 | $Al_{0.67}Ti_{0.21}Cr_{0.12}$ | $Al_{0.80}Ti_{0.08}Cr_{0.12}$ |
| Comparative sample 6 | $Al_{0.78}Ti_{0.17}Si_{0.05}$ | $Al_{0.81}Ti_{0.14}Si_{0.05}$ |
| Comparative sample 7 | $Al_{0.70}Ti_{0.30}$ | $Al_{0.70}Ti_{0.30}$ |

TABLE 2

| | Coating layer | | | | |
|---|---|---|---|---|---|
| | Hard layer | | Outer layer | | Overall |
| Sample No. | Composition | Average thickness (μm) | Composition | Average thickness (μm) | average thickness (μm) |
| Invention sample 1 | $(Al_{0.68}Ti_{0.32})N$ | 3.0 | — | — | 3.0 |
| Invention sample 2 | $(Al_{0.62}Ti_{0.38})N$ | 1.3 | — | — | 1.3 |
| Invention sample 3 | $(Al_{0.70}Ti_{0.30})N$ | 2.0 | — | — | 2.0 |
| Invention sample 4 | $(Al_{0.82}Ti_{0.18})N$ | 2.5 | — | — | 2.5 |
| Invention sample 5 | $(Al_{0.70}Ti_{0.30})N$ | 5.0 | TiN | 1.0 | 6.0 |

TABLE 2-continued

| | Coating layer | | | | |
|---|---|---|---|---|---|
| | Hard layer | | Outer layer | | Overall |
| Sample No. | Composition | Average thickness (μm) | Composition | Average thickness (μm) | average thickness (μm) |
| Invention sample 6 | $(Al_{0.72}Ti_{0.28})N$ | 9.0 | CrN | 3.4 | 12.4 |
| Invention sample 7 | $(Al_{0.64}Ti_{0.18}Nb_{0.18})N$ | 4.0 | NbN | 2.0 | 6.0 |
| Invention sample 8 | $(Al_{0.75}Ti_{0.14}W_{0.11})N$ | 3.0 | $(Al_{0.50}Ti_{0.50})N$ | 1.0 | 4.0 |
| Invention sample 9 | $(Al_{0.64}Ti_{0.26}Si_{0.10})N$ | 3.5 | $(Ti_{0.85}Al_{0.15})N$ | 1.0 | 4.5 |
| Invention sample 10 | $(Al_{0.65}Ti_{0.10}Cr_{0.25})N$ | 3.0 | $(Al_{0.15}Cr_{0.80}Si_{0.05})N$ | 1.8 | 4.8 |
| Invention sample 11 | $(Al_{0.64}Ti_{0.28}Mo_{0.08})N$ | 2.3 | $(Al_{0.40}Ti_{0.60})N$ | 0.5 | 2.8 |
| Invention sample 12 | $(Al_{0.77}Ti_{0.18}Hf_{0.05})N$ | 1.8 | $(Al_{0.80}Cr_{0.20})N$ | 0.3 | 2.1 |
| Invention sample 13 | $(Al_{0.62}Ti_{0.31}Zr_{0.07})N$ | 3.3 | $(Al_{0.55}Ti_{0.35}Cr_{0.10})N$ | 0.4 | 3.7 |
| Invention sample 14 | $(Al_{0.62}Ti_{0.27}V_{0.11})N$ | 2.8 | TiCN | 0.4 | 3.2 |

* The "composition" of a hard layer is served by the position in thickness which corresponds to 50% of the average thickness of the hard layer.
The "—" symbols in the "composition" and "average thickness" columns indicate that an outer layer is not formed.

TABLE 3

| | Coating layer | | | | |
|---|---|---|---|---|---|
| | First layer | | Second layer | | Overall |
| Sample No. | Composition | Average thickness (μm) | Composition | Average thickness (μm) | average thickness (μm) |
| Comparative sample 1 | $(Al_{0.55}Ti_{0.45})N$ | 3.5 | — | — | 3.5 |
| Comparative sample 2 | $(Al_{0.75}Ti_{0.25})N$ | 3.0 | — | — | 3.0 |
| Comparative sample 3 | $(Al_{0.55}Ti_{0.45})N$ | 4.0 | — | — | 4.0 |
| Comparative sample 4 | $(Al_{0.87}Ti_{0.13})N$ | 5.0 | — | — | 5.0 |
| Comparative sample 5 | $(Al_{0.72}Ti_{0.16}Cr_{0.12})N$ | 3.5 | $(Al_{0.80}Cr_{0.15}Si_{0.05})N$ | 1.5 | 5.0 |
| Comparative sample 6 | $(Al_{0.80}Ti_{0.15}Si_{0.05})N$ | 2.5 | $(Ti_{0.95}Si_{0.05})N$ | 1.0 | 3.5 |
| Comparative sample 7 | $(Al_{0.70}Ti_{0.30})N$ | 3.0 | — | — | 3.0 |

* The "composition" of a first layer is served by the position in thickness which corresponds to 50% of the average thickness of the first layer.
The "—" symbols in the "composition" and "average thickness" columns indicate that a second layer is not formed.

TABLE 4

| | Lower region | | | Intermediate region | | | |
|---|---|---|---|---|---|---|---|
| Sample No. | Temperature (° C.) | $N_2$:Ar | Voltage (V) | Temperature (° C.) | $N_2$:Ar | Voltage (V) | Cooling rate (° C./hour) |
| Invention sample 1 | 600 | 2:8 | −80 | 450 | 4:6 | −80 | 40 |
| Invention sample 2 | 580 | 3:7 | −80 | 500 | 5:5 | −70 | 20 |
| Invention sample 3 | 550 | 2:8 | −90 | 440 | 4:6 | −60 | 50 |
| Invention sample 4 | 520 | 2:8 | −100 | 400 | 4:6 | −80 | 50 |
| Invention sample 5 | 570 | 3:7 | −80 | 430 | 4:6 | −60 | 35 |
| Invention sample 6 | 570 | 3:7 | −80 | 400 | 5:5 | −70 | 15 |
| Invention sample 7 | 560 | 2:8 | −100 | 480 | 5:5 | −80 | 30 |
| Invention sample 8 | 550 | 3:7 | −90 | 460 | 5:5 | −70 | 25 |
| Invention sample 9 | 530 | 3:7 | −100 | 440 | 4:6 | −70 | 35 |

TABLE 4-continued

| | | | | | | | |
|---|---|---|---|---|---|---|---|
| Invention sample 10 | 590 | 3:7 | −80 | 470 | 5:5 | −80 | 30 |
| Invention sample 11 | 500 | 3:7 | −95 | 450 | 5:5 | −80 | 40 |
| Invention sample 12 | 520 | 2:8 | −100 | 410 | 4:6 | −80 | 50 |
| Invention sample 13 | 600 | 2:8 | −80 | 490 | 5:5 | −75 | 40 |
| Invention sample 14 | 570 | 3:7 | −80 | 470 | 5:5 | −60 | 35 |

| | Upper region | | | |
|---|---|---|---|---|
| | Temperature (° C.) | $N_2$:Ar | Voltage (V) | Cooling rate (° C./hour) |
| Invention sample 1 | 390 | 6:4 | −60 | 10 |
| Invention sample 2 | 400 | 7:3 | −60 | 20 |
| Invention sample 3 | 370 | 6:4 | −50 | 25 |
| Invention sample 4 | 300 | 6:4 | −60 | 45 |
| Invention sample 5 | 350 | 6:4 | −40 | 35 |
| Invention sample 6 | 300 | 6:4 | −60 | 15 |
| Invention sample 7 | 390 | 7:3 | −50 | 20 |
| Invention sample 8 | 380 | 7:3 | −60 | 20 |
| Invention sample 9 | 320 | 6:4 | −40 | 30 |
| Invention sample 10 | 400 | 6:4 | −60 | 25 |
| Invention sample 11 | 390 | 7:3 | −50 | 25 |
| Invention sample 12 | 380 | 6:4 | −60 | 40 |
| Invention sample 13 | 400 | 7:3 | −55 | 30 |
| Invention sample 14 | 370 | 6:4 | −50 | 30 |

TABLE 5

| | First layer | | | | | | |
|---|---|---|---|---|---|---|---|
| | Lower region | | | Intermediate region | | | |
| Sample No. | Temperature (° C.) | $N_2$:Ar | Voltage (V) | Temperature (° C.) | $N_2$:Ar | Voltage (V) | Cooling rate (° C./hour) |
| Comparative sample 1 | 460 | 7:3 | −80 | 400 | 7:3 | −80 | 30 |
| Comparative sample 2 | 150 | 5:5 | −60 | 370 | 4:6 | −80 | 70 |
| Comparative sample 3 | 650 | 10:0 | −90 | 580 | 7:3 | −90 | 45 |
| Comparative sample 4 | 550 | 6:4 | −60 | 480 | 5:5 | −80 | 8 |
| Comparative sample 5 | 520 | 10:0 | −120 | 400 | 10:0 | −100 | 40 |
| Comparative sample 6 | 500 | 5:5 | −80 | 480 | 6:4 | −70 | 0 |
| Comparative sample 7 | 450 | 5:5 | −100 | Formed under the lower region conditions | | | |

| | First layer Upper region | | | |
|---|---|---|---|---|
| Sample No. | Temperature (° C.) | $N_2$:Ar | Voltage (V) | Cooling rate (° C./hour) |
| Comparative sample 1 | 350 | 5:5 | −70 | 25 |
| Comparative sample 2 | 300 | 4:6 | −80 | 60 |
| Comparative sample 3 | 500 | 5:5 | −90 | 30 |
| Comparative sample 4 | 460 | 4:6 | −100 | 5 |
| Comparative sample 5 | 500 | 10:0 | −80 | 15 |
| Comparative sample 6 | 480 | 7:3 | −60 | 0 |
| Comparative sample 7 | Formed under the lower region conditions | | | |

As to the average thickness of each layer of each of the obtained samples, such average thickness was obtained by: measuring the thickness of each layer via an SEM observation of each of the cross-sectional surfaces at three locations near the position 50 μm from the edge of a surface facing the metal evaporation source of the coated cutting tool, toward the center of such surface; and calculating the average value of the resulting measurements. The composition of each layer of the obtained sample was measured from the cross-sectional surface near the position at most 50 μm from the edge of a surface facing the metal evaporation source of the coated cutting tool, toward the center of such surface, using an EDS. The measurement results are shown in Tables 2 and 3. It should be noted that each of the composition of the hard layer and the composition of the first layer in each comparative sample was served by the composition obtained at the position in thickness which corresponds to 50% of each average thickness. The composition ratio of the metal elements of each layer in each of Tables 2 and 3 refers to an atomic ratio of each metal element relative to all the metal elements in the metal compound which constitutes each layer. Further, the results of the atomic ratios of the Al element in the regions of the hard layer and the regions of the first layer in each comparative sample are shown in Tables 6 and 7. As to comparative sample 7, the thickness of the first layer was divided into three equal parts, and such equal parts were regarded as a lower region, an intermediate region and an upper region, in order from the substrate side.

TABLE 6

| | Hard layer | | | | | |
|---|---|---|---|---|---|---|
| | Lower region | | Intermediate region | | Upper region | |
| Sample No. | Al atomic ratio (%) | Thickness (μm) | Al atomic ratio (%) | Thickness (μm) | Al atomic ratio (%) | Thickness (μm) |
| Invention sample 1 | 66 | 1.0 | 68 | 1.0 | 70 | 1.0 |
| Invention sample 2 | 61 | 0.5 | 62 | 0.3 | 64 | 0.5 |
| Invention sample 3 | 67 | 0.7 | 70 | 0.6 | 75 | 0.7 |
| Invention sample 4 | 80 | 0.8 | 82 | 0.9 | 85 | 0.8 |
| Invention sample 5 | 67 | 1.5 | 70 | 2.0 | 75 | 1.5 |
| Invention sample 6 | 69 | 2.5 | 72 | 4.0 | 77 | 2.5 |
| Invention sample 7 | 62 | 1.0 | 64 | 2.0 | 67 | 1.0 |
| Invention sample 8 | 70 | 0.5 | 73 | 0.5 | 75 | 2.0 |
| Invention sample 9 | 64 | 2.0 | 66 | 0.5 | 68 | 1.0 |
| Invention sample 10 | 60 | 1.0 | 61 | 1.0 | 63 | 1.0 |
| Invention sample 11 | 62 | 0.8 | 64 | 0.7 | 66 | 0.8 |
| Invention sample 12 | 75 | 0.5 | 77 | 0.8 | 78 | 0.5 |
| Invention sample 13 | 60 | 1.1 | 62 | 1.1 | 67 | 1.1 |
| Invention sample 14 | 60 | 0.9 | 62 | 1.0 | 65 | 0.9 |

TABLE 7

| | First layer | | | | | |
|---|---|---|---|---|---|---|
| | Lower region | | Intermediate region | | Upper region | |
| Sample No. | Al atomic ratio (%) | Thickness (μm) | Al atomic ratio (%) | Thickness (μm) | Al atomic ratio (%) | Thickness (μm) |
| Comparative sample 1 | 53 | 1.2 | 55 | 1.1 | 57 | 1.2 |
| Comparative sample 2 | 74 | 1.0 | 75 | 1.0 | 75 | 1.0 |
| Comparative sample 3 | 53 | 1.2 | 55 | 1.6 | 57 | 1.2 |
| Comparative sample 4 | 85 | 1.5 | 87 | 2.0 | 88 | 1.5 |
| Comparative sample 5 | 67 | 1.0 | 72 | 1.5 | 80 | 1.0 |
| Comparative sample 6 | 78 | 1.0 | 80 | 0.5 | 81 | 1.0 |
| Comparative sample 7 | 70 | 1.0 | 70 | 1.0 | 70 | 1.0 |

As to the obtained samples, the average particle size concerning each region in the hard layer was obtained via observation of a cross-sectional structure of the hard layer. More specifically, mirror polishing was performed on a cross-sectional surface in a direction orthogonal to the surface of the substrate, and the resulting mirror-polished surface was regarded as a cross-sectional structure. When mirror-polishing the hard layer, colloidal silica was used for polishing. A cross-sectional structure of each region was observed using an FE-SEM at a magnification of 20,000 times. The particle size of each particle of the hard layer was served by a distance between particles in a direction parallel to the surface of the substrate. At this time, the distance between particles was defined as a distance between positions which attained the longest distance between the particles. Measurement was performed with regard to a range, in each region, which was surrounded by a rectangle of 10 μm in a direction parallel to the substrate surface and 0.5 μm in a direction orthogonal to the substrate surface. Measurement was performed near the position 50 μm from the edge of a surface facing the metal evaporation source, toward the center of such surface. Particle sizes were measured in cross-sectional structures at three or more locations, and the average value (arithmetic mean) of the obtained particle sizes of all the particles was regarded as an average particle size. The results of the average particle sizes of the samples are shown in Tables 8 and 9.

TABLE 8

| | Hard layer | | |
|---|---|---|---|
| Sample No. | Lower region Average particle size (nm) | Intermediate region Average particle size (nm) | Upper region Average particle size (nm) |
| Invention sample 1 | 83 | 148 | 180 |
| Invention sample 2 | 95 | 112 | 130 |
| Invention sample 3 | 66 | 121 | 139 |
| Invention sample 4 | 13 | 64 | 110 |
| Invention sample 5 | 58 | 110 | 137 |
| Invention sample 6 | 61 | 129 | 149 |
| Invention sample 7 | 88 | 221 | 253 |
| Invention sample 8 | 20 | 76 | 120 |
| Invention sample 9 | 51 | 72 | 105 |
| Invention sample 10 | 89 | 423 | 468 |
| Invention sample 11 | 80 | 181 | 222 |

TABLE 8-continued

| | Hard layer | | |
|---|---|---|---|
| Sample No. | Lower region Average particle size (nm) | Intermediate region Average particle size (nm) | Upper region Average particle size (nm) |
| Invention sample 12 | 86 | 141 | 179 |
| Invention sample 13 | 75 | 220 | 243 |
| Invention sample 14 | 64 | 160 | 192 |

TABLE 9

| | First layer | | |
|---|---|---|---|
| Sample No. | Lower region Average particle size (nm) | Intermediate region Average particle size (nm) | Upper region Average particle size (nm) |
| Comparative sample 1 | 153 | 250 | 292 |
| Comparative sample 2 | 34 | 50 | 62 |
| Comparative sample 3 | 94 | 178 | 206 |
| Comparative sample 4 | 20 | 32 | 32 |
| Comparative sample 5 | 90 | 144 | 102 |
| Comparative sample 6 | 41 | 50 | 50 |
| Comparative sample 7 | 60 | 60 | 60 |

Using the obtained samples, the following cutting test was conducted for performing evaluations.
[Cutting test]
Workpiece: Inconel 718
Workpiece shape: Cylinder of φ120 mm×400 mm
Cutting speed: 60 m/min
Feed: 0.2 mm/rev
Depth of cut: 1.0 mm
Coolant: Used
Evaluation items: a time when a sample was fractured or had a flank wear width or boundary wear width of 0.3 mm was defined as the end of the tool life, and the machining time to reach the end of the tool life was measured
The results of the cutting test are shown in Table 10.

TABLE 10

| | Cutting test | |
|---|---|---|
| Sample No. | Machining time (min) | Damage form |
| Invention sample 1 | 35 | Normal wear |
| Invention sample 2 | 28 | Normal wear |
| Invention sample 3 | 31 | Normal wear |
| Invention sample 4 | 22 | Normal wear |
| Invention sample 5 | 33 | Normal wear |
| Invention sample 6 | 20 | Normal wear |
| Invention sample 7 | 34 | Normal wear |
| Invention sample 8 | 33 | Normal wear |
| Invention sample 9 | 24 | Normal wear |
| Invention sample 10 | 26 | Normal wear |
| Invention sample 11 | 24 | Normal wear |
| Invention sample 12 | 20 | Normal wear |
| Invention sample 13 | 21 | Normal wear |
| Invention sample 14 | 18 | Normal wear |
| Comparative sample 1 | 7 | Fracturing |
| Comparative sample 2 | 9 | Normal wear |
| Comparative sample 3 | 11 | Fracturing |
| Comparative sample 4 | 8 | Normal wear |
| Comparative sample 5 | 6 | Normal wear |
| Comparative sample 6 | 5 | Normal wear |
| Comparative sample 7 | 5 | Fracturing |

Comparative samples 1, 3 and 7 each involved fracturing of the sample during the cutting test. Since crater wear was found in the sample, the factor for such fracturing can be considered to reside in the fact that the progress of oxidation reduced the strength of the edge.

The results of Table 10 indicate that the machining time of each invention sample is longer than the machining time of each comparative sample. Therefore, it is apparent that each invention sample has excellent fracture resistance and therefore has a longer tool life.

INDUSTRIAL APPLICABILITY

As to a coated cutting tool according to the present invention, since such coated cutting tool has excellent fracture resistance and since the tool life can therefore be extended more than that involved in the prior art, the coated cutting tool has high industrial applicability.

REFERENCE SIGNS LIST

1: Substrate, 2: Hard layer, 2A: Lower region, 2B: Upper region, 2C: Intermediate region, 3: Outer layer, 4: Coating layer, 10, 20: Coated cutting tool.

What is claimed is:
1. A coated cutting tool comprising a substrate and a coating layer formed on a surface of the substrate,
the coating layer including at least one primary layer, wherein:
the primary layer is a layer containing a compound having a composition represented by a formula below:
$(Al_xTi_yM_{1-x-y})N$
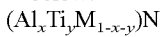
wherein M denotes an element of at least one kind selected from the group consisting of Zr, Hf, V, Nb, Ta, Cr, Mo, W and Si, x denotes an atomic ratio of the Al element based on a total of the Al element, the Ti element and a metal element denoted by M, y denotes an atomic ratio of the Ti element based on a total of the Al element, the Ti element and the metal element denoted by M, x satisfies $0.60 \leq x \leq 0.85$, y satisfies $0 \leq y \leq 0.40$, and x+y satisfies $0.60 \leq x+y \leq 1.00$;
an average thickness of the primary layer is from 1.4 μm or more to 15 μm or less; and
the primary layer has an upper region and a lower region which satisfy conditions (1), (2) and (3) below:
condition (1): the upper region has an average thickness of from 0.5 μm or more to 2.5 μm or less ranging from an interface which is close to a surface of the coated cutting tool toward the substrate, the average thickness of the upper region being less than an average thickness of the primary layer, and the lower region has an average thickness of from 0.5 μm or more to 2.5 μm or less ranging from an interface which is close to the substrate toward the surface of the coated cutting tool, the average thickness of the lower region being less than the average thickness of the primary layer;
(2) an atomic ratio of the Al element contained in the upper region is higher, by from 3 atom % or higher to 10 atom % or lower, than an atomic ratio of the Al element contained in the lower region; and
(3) an average particle size in the upper region is greater than an average particle size in the lower region, wherein
an average particle size in the upper region is from 100 nm or more to 500 nm or less,
an average particle size in the lower region is from 10 nm or more to 100 nm or less, the primary layer includes an intermediate region between the upper region and the lower region, an atomic ratio of the Al element in the intermediate region is lower than that in the upper region and higher than that in the lower region, an average particle size in the intermediate region is from 60 nm or more to 475 nm or less and is smaller than an average particle size in the upper region and greater than an average particle size in the lower region, and the intermediate region has an average thickness of from 0.1 µm to 4.0 µm.

2. The coated cutting tool according to claim 1, wherein the average particle size in the lower region is from 10 nm or more to 80 nm or less.

3. The coated cutting tool according to claim 1, wherein the primary layer is a layer located closest to the substrate in the coating layer.

4. The coated cutting tool according to claim 1, wherein:

the coating layer comprises, on a side of the primary layer which is opposite to the substrate, an outer layer containing a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and an average thickness of the outer layer is from 0.1 µm or more to 3.5 µm or less.

5. The coated cutting tool according to claim 1, wherein an average thickness of the coating layer is from 1.5 µm or more to 15 µm or less.

6. The coated cutting tool according to claim 1, wherein the substrate is a cemented carbide, cermet, ceramics or a cubic boron nitride sintered body.

7. The coated cutting tool according to claim 2, wherein:

the coating layer comprises, on a side of the primary layer which is opposite to the substrate, an outer layer containing a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and an average thickness of the outer layer is from 0.1 µm or more to 3.5 µm or less.

8. The coated cutting tool according to claim 3, wherein:

the coating layer comprises, on a side of the primary layer which is opposite to the substrate, an outer layer containing a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and an average thickness of the outer layer is from 0.1 µm or more to 3.5 µm or less.

9. The coated cutting tool according to claim 4, wherein an average thickness of the coating layer is from 1.5 µm or more to 15 µm or less.

10. The coated cutting tool according to claim 3, wherein the substrate is a cemented carbide, cermet, ceramics or a cubic boron nitride sintered body.

11. The coated cutting tool according to claim 4, wherein the substrate is a cemented carbide, cermet, ceramics or a cubic boron nitride sintered body.

* * * * *